United States Patent
Hirabayashi

(10) Patent No.: US 7,532,539 B2
(45) Date of Patent: May 12, 2009

(54) SEMICONDUCTOR DEVICE WHOSE OPERATION FREQUENCY AND POWER SUPPLY VOLTAGE ARE DYNAMICALLY CONTROLLED ACCORDING TO LOAD

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 11/833,485

(22) Filed: Aug. 3, 2007

(65) Prior Publication Data
US 2008/0037355 A1     Feb. 14, 2008

(30) Foreign Application Priority Data
Aug. 11, 2006   (JP)   .............................. 2006-220364

(51) Int. Cl.
*G11C 8/00*      (2006.01)
(52) U.S. Cl. ................... 365/230.06; 365/155; 365/202; 365/203; 365/210.12
(58) Field of Classification Search ............ 365/230.06, 365/230.03, 155, 154, 210.12, 179, 207, 365/202, 203
See application file for complete search history.

(56) References Cited

U.S. PATENT DOCUMENTS

| 6,097,662 | A | 8/2000 | Itou | |
|---|---|---|---|---|
| 7,248,519 | B2* | 7/2007 | Kim | ........................... 365/203 |
| 2003/0151964 | A1* | 8/2003 | Takahashi et al. | ........... 365/204 |

FOREIGN PATENT DOCUMENTS

JP     2006-73065     3/2006

* cited by examiner

*Primary Examiner*—Tuan T Nguyen
*Assistant Examiner*—Toan Le
(74) *Attorney, Agent, or Firm*—Oblon, Spivak, McClelland, Maier & Neustadt, P.C.

(57) ABSTRACT

A semiconductor device whose operation frequency and power supply voltage are dynamically controlled according to a load subjected to a process to be performed is disclosed. The semiconductor device includes a memory cell array having SRAM cells arranged in an array form, word lines connected to the SRAM cells for respective rows, a row decoder which selects the word lines one by one during normal operation and multi-select word lines which are not adjacent to each other during low-voltage operation, a load circuit which sets the level of the selected word line to potential lower than power supply voltage, and a controller which controls the row decoder and load circuit to selectively control selection of the word lines and the load circuit.

20 Claims, 9 Drawing Sheets

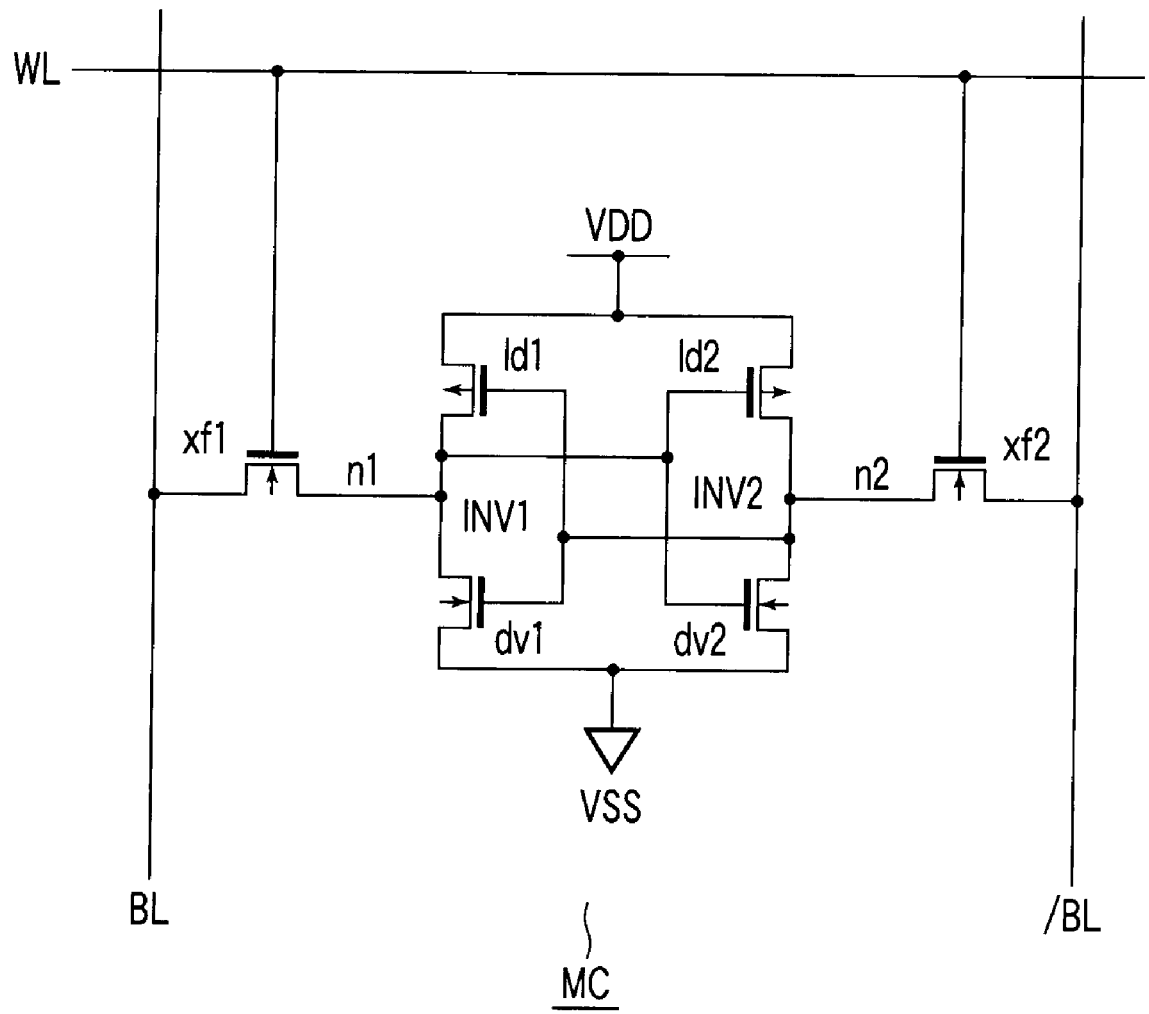
F I G. 2

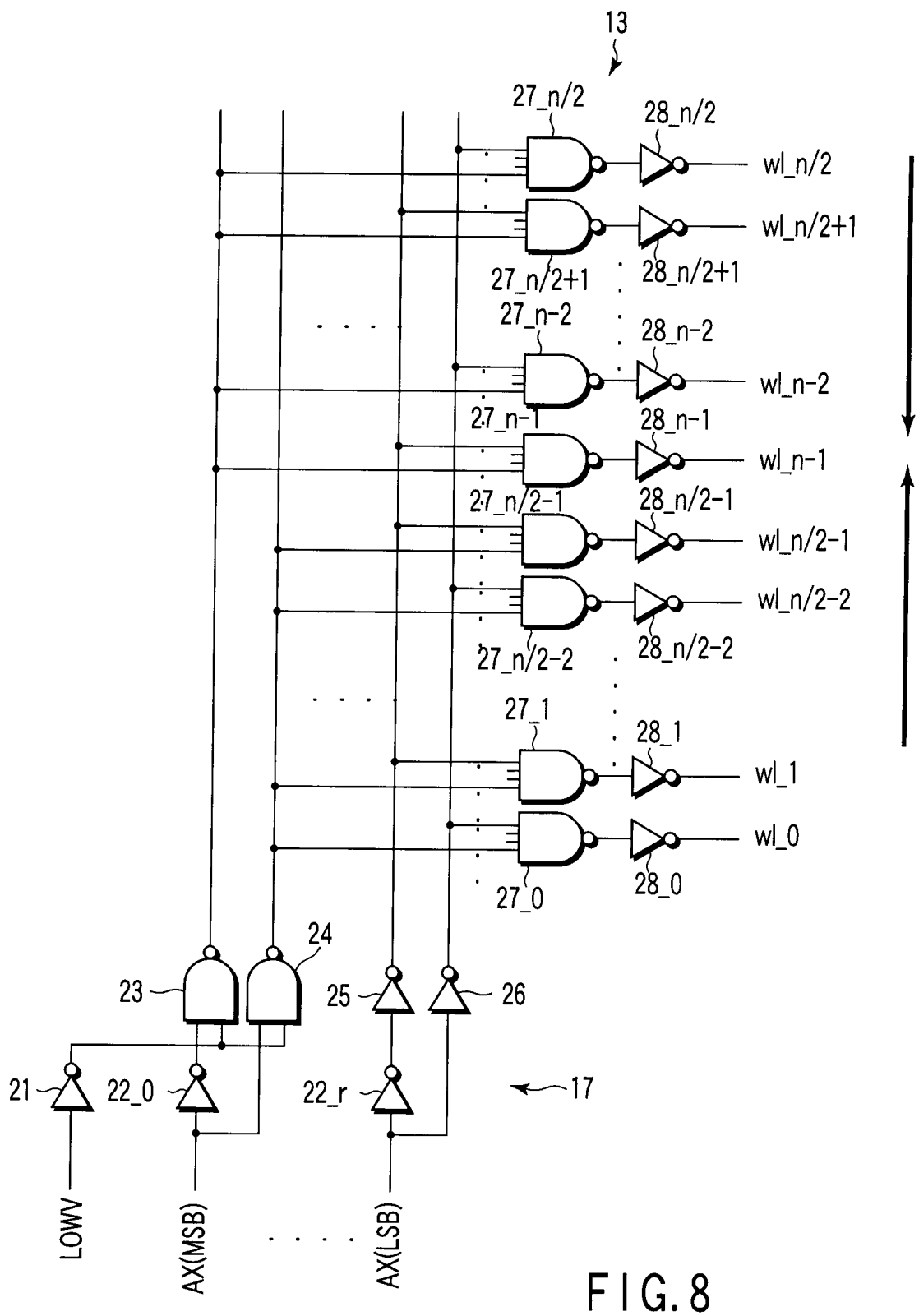
F I G. 8

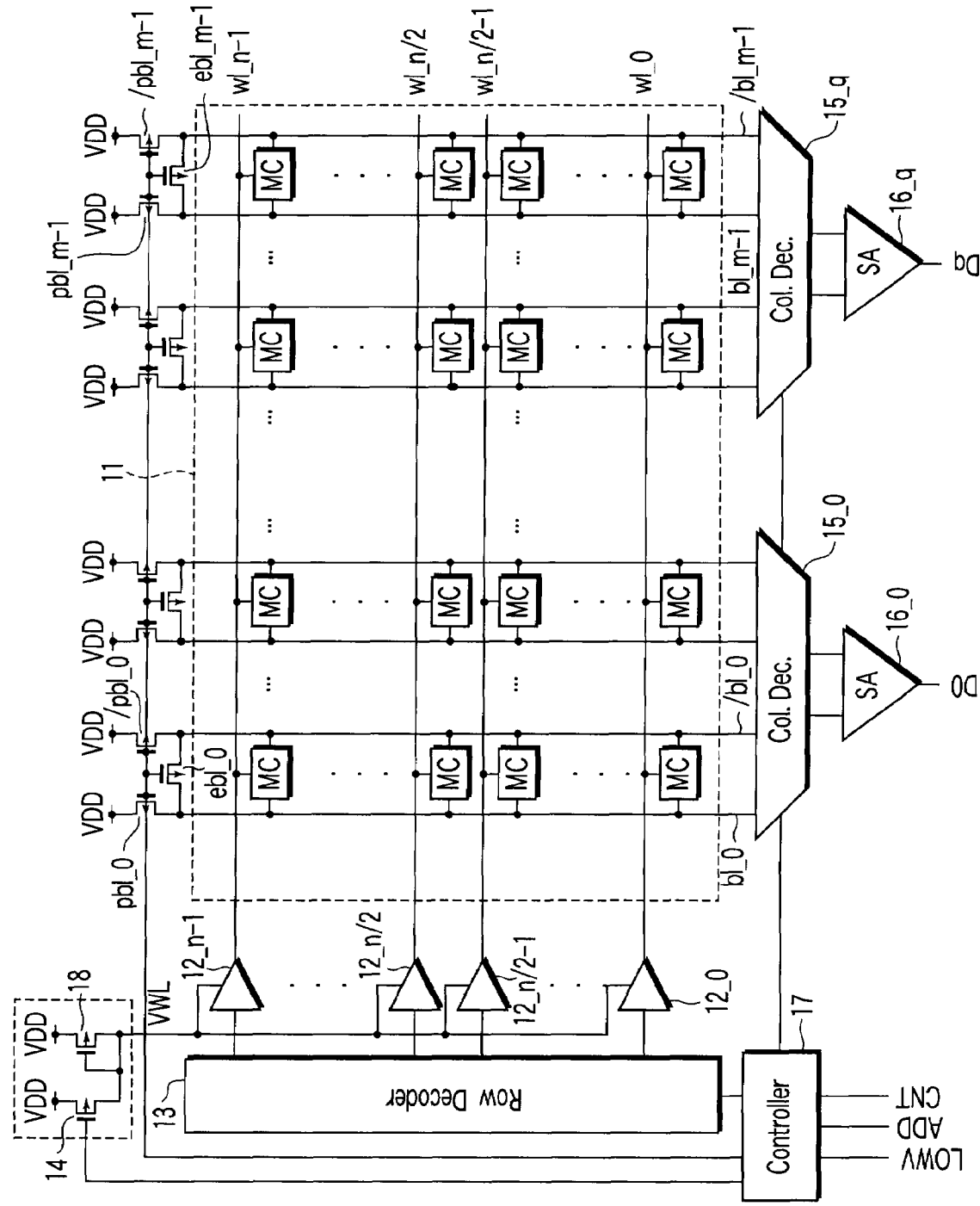
F I G. 10

SEMICONDUCTOR DEVICE WHOSE OPERATION FREQUENCY AND POWER SUPPLY VOLTAGE ARE DYNAMICALLY CONTROLLED ACCORDING TO LOAD

CROSS-REFERENCE TO RELATED APPLICATIONS

This application is based upon and claims the benefit of priority from prior Japanese Patent Application No. 2006-220364, filed Aug. 11, 2006, the entire contents of which are incorporated herein by reference.

BACKGROUND OF THE INVENTION

1. Field of the Invention

This invention relates to a semiconductor device whose operation frequency and power supply voltage are dynamically controlled according to a workload (load) subjected to a process to be performed and, for example, applied to an LSI used for a portable equipment and having a cache SRAM incorporated therein.

2. Description of the Related Art

In LSIs used for portable equipment, a method for dynamically controlling the operation frequency (clock) and power supply voltage according to a load subjected to a process to be performed in order to suppress the power consumption is used. When a process for a heavy load is performed, the power supply voltage is enhanced and the operation frequency is enhanced to cope with the process with high power and high speed. On the other hand, when a process for a light load is performed, the power consumption is suppressed by lowering the power supply voltage and lowering the operation frequency. In order to attain the operation of lowering the power consumption of the LSI using the above method, it is important to set the operation voltage as low as possible at the light-load time.

However, it becomes difficult to perform the low-voltage operation of an SRAM often used as a cache memory element in the LSI with a reduction in the device based on the scaling rule.

For example, as is disclosed in Jpn. Pat. Appln. KOKAI Publication No. 2006-073065, a six-transistor SRAM cell is configured by a pair of PMOS load transistors, a pair of NMOS drive transistors and a pair of NMOS transfer transistors. One of the PMOS load transistors and one of the NMOS drive transistors are combined to configure a CMOS inverter. Likewise, the other one of the PMOS load transistors and the other one of the NMOS drive transistors are combined to configure a CMOS inverter. The input terminals and output terminals of the two CMOS inverters are cross-coupled to configure a flip-flop circuit to store data. The current paths of the pair of NMOS transfer transistors are respectively connected between the storage nodes of the flip-flop circuit and paired bit lines. A word line is connected to the gates of the NMOS transfer transistors to select the cell.

When the cell is not selected, the word line is set at a low potential level and the pair of NMOS transfer transistors are made to not conduct (turned off). As a result, one of the storage nodes holds the power supply voltage VDD and the other storage node holds the ground potential VSS. On the other hand, when the cell is selected, the word line is set at a high potential level, the pair of NMOS transfer transistors are made to conduct (turned on) and the potentials of the paired bit lines vary according to the potentials of the storage nodes. The potential variation in the paired bit lines is amplified by means of a sense amplifier and stored data is read.

At this time, since both of the paired bit lines are generally precharged to the power supply voltage VDD, the potential of one of the storage nodes which is set at the lower level (ground potential VSS) is slightly pulled up via the NMOS transfer transistor. At this time, if a variation (rise) in the potential level of the storage node is large and exceeds the threshold voltage of the flip-flop circuit, the state of the flip-flop circuit is inverted and stored data will be destroyed.

The degree of the rise in the level of the storage node is determined based on the ratio of the pull-down ability of the NMOS drive transistor to the pull-up ability of the NMOS transfer transistor. Therefore, in order to stabilize the cell, it is important to make the $\beta$ ratio of the NMOS drive transistor and the NMOS transfer transistor large.

There occurs a problem due to a large variation in the characteristics of elements with miniaturization of each element based on the scaling rule. In order to prevent occurrence of data destruction even when the characteristics vary, it is necessary to securely attain a sufficiently high $\beta$ ratio. When the operation voltage is lowered, the influence of the characteristic variation becomes relatively larger. Therefore, it is necessary to set a sufficiently high $\beta$ ratio in order to stably operate the cell on the low voltage.

However, when the size (channel width) of the NMOS drive transistor in the SRAM cell is increased in order to increase the $\beta$ ratio, the pattern-occupied area is increased. Recently, the rate of the area of the cache SRAM which occupies the chip becomes increasingly higher as the LSI is made to have highly sophisticated functions. Therefore, an increase in the cell area gives a large influence on the chip size. In order to reduce the chip size, it is necessary to set the SRAM cell as small as possible and it becomes difficult to securely attain a sufficiently high $\beta$ ratio. Thus, there occurs a problem that the operation voltage of the SRAM section cannot be lowered and the power consumption at the light-load time cannot be sufficiently suppressed.

BRIEF SUMMARY OF THE INVENTION

According to one aspect of this invention, there is provided a semiconductor device whose operation frequency and power supply voltage are dynamically controlled according to a load subjected to a process to be performed, comprising a memory cell array having SRAM cells arranged in an array form, word lines connected to the SRAM cells of the memory cell array for respective rows in the memory cell array, a row decoder configured to select the word lines one by one during heavy-load operation and multi-select separated word lines during light-load operation, a load circuit configured to set levels of the multi-selected word lines to potential lower than power supply voltage, and a controller configured to control the row decoder and load circuit to selectively control a selection operation of the word lines and a level setting operation of the word lines by the load circuit.

According to another aspect of this invention, there is provided a semiconductor device comprising a memory cell array having SRAM cells arranged in an array form, word lines connected to the SRAM cells of the memory cell array for respective rows, bit line pairs connected to the SRAM cells of the memory cell array for respective columns, a row decoder configured to select the word lines one by one during heavy-load operation and multi-select separated word lines during light-load operation, a word line driver configured to drive the word lines based on a decode signal supplied from the row decoder, a precharge/equalize circuit configured to precharge and equalize the paired bit lines, a column decoder configured to select the bit line pairs for every plural bit line pairs used as one unit, a sense amplifier configured to amplify a potential variation of the bit line pair selected by the column decoder and read stored data, a load circuit configured to set levels of the multi-selected word lines to potential lower than power supply voltage, and a controller configured to control the precharge/equalize circuit, row decoder, column decoder and load circuit to selectively control a selection operation of the word lines and a level setting operation of the word lines by the load circuit.

According to still another aspect of this invention, there is provided a semiconductor device comprising a memory cell array having SRAM cells arranged in an array form, word lines connected to the SRAM cells of the memory cell array for respective rows, bit line pairs connected to the SRAM cells of the memory cell array for respective columns, a row decoder configured to select the word lines one by one during heavy-load operation and multi-select separated word lines during light-load operation, a word line driver configured to drive the word lines based on a decode signal supplied from the row decoder, a precharge/equalize circuit configured to precharge and equalize the paired bit lines, a column decoder configured to select data of the bit line pair for every plural bit line pairs used as one unit, a sense amplifier configured to amplify a potential variation of the bit line pair selected by the column decoder and read stored data, and a controller configured to control the precharge/equalize circuit, row decoder, column decoder and load circuit to selectively control a selection operation of the word lines and a level setting operation of the word lines by the load circuit, wherein potential lower than power supply voltage is applied to a power supply terminal of the word line driver when the word lines are multi-selected.

BRIEF DESCRIPTION OF THE SEVERAL VIEWS OF THE DRAWING

FIG. 2 is a circuit diagram showing an example of the configuration of each memory cell in the circuit shown in FIG. 1;

FIG. 8 is a circuit diagram showing another concrete example of the configuration of extracted portions of the controller and row decoder in the circuit shown in FIG. 1;

FIG. 10 is a circuit diagram schematically showing an extracted portion of the configuration of a memory cell array of a cache SRAM and the peripheral portion thereof, for illustrating a semiconductor device according to a third embodiment of this invention.

DETAILED DESCRIPTION OF THE INVENTION

FIRST EMBODIMENT

Figure 1:
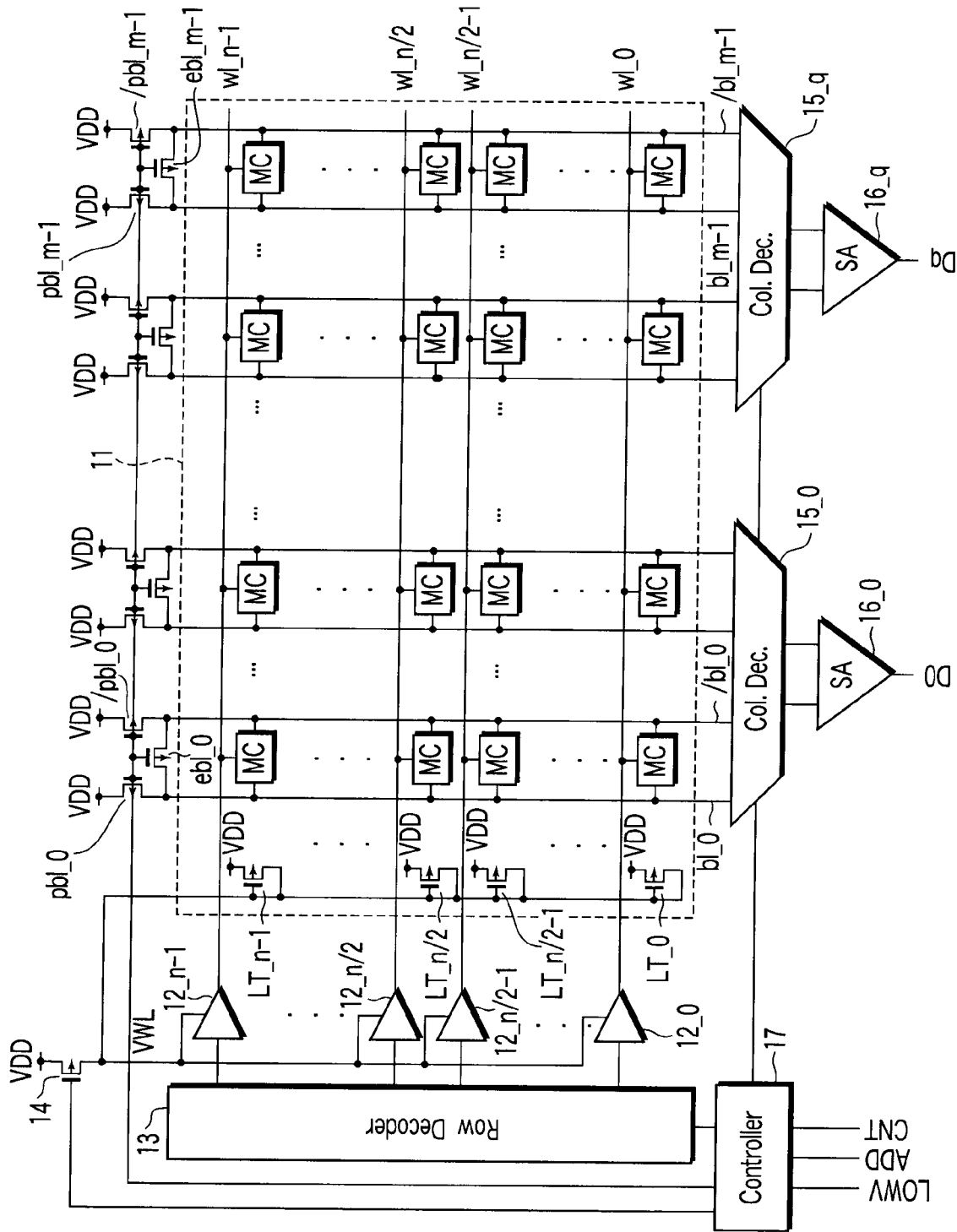
FIG. 1 is a circuit diagram schematically showing an extracted portion of the configuration of a memory cell array of a cache SRAM and the peripheral portion thereof, for illustrating a semiconductor device according to a first embodiment of this invention.

FIG. 1 is a circuit diagram schematically showing an extracted portion of the configuration of a memory cell array of a cache SRAM and the peripheral portion thereof, for illustrating a semiconductor device according to a first embodiment of this invention. The cache SRAM is incorporated in an LSI whose operation frequency and power supply voltage are dynamically controlled according to a load subjected to a process to be performed.

In a memory cell array 11, memory cells (SRAM cells) MC are arranged in a matrix form of n rows×m columns. The memory cells MC of each row are connected to a corresponding one of word lines $wl\_0$ to $wl\_n-1$ and the memory cells MC of each column are connected to a corresponding one of paired bit lines $bl\_0$, $/bl\_0$ to $bl\_m-1$, $/bl\_m-1$.

The current paths of PMOS transistors $pbl\_0$, $/pbl\_0$ to $pbl\_m-1$, $/pbl\_m-1$ which precharge the paired bit lines are respectively connected between one-side ends of the paired bit lines $bl\_0$, $/bl\_0$ to $bl\_m-1$, $/bl\_m-1$ and the power supply node VDD. Further, the current paths of PMOS transistors $ebl\_0$ to $ebl\_m-1$ which equalize the paired bit lines are respectively connected between the paired bit lines $bl\_0$ and $/bl\_0$, ..., and $bl\_m-1$ and $/bl\_m-1$.

The output terminals of word line drivers $12\_0$ to $12\_n-1$ are respectively connected to one-side ends of the word lines $wl\_0$ to $wl\_n-1$ to drive the word lines. The input terminals of the word line drivers $12\_0$ to $12\_n-1$ are respectively connected to the output terminals of a row decoder (Row Decoder) 13 and supplied with row decode signals and voltage (word line voltage) VWL is applied to the power supply terminals thereof. One end of the current path of a PMOS transistor (transistor switch) 14 is connected to the power supply terminals of the word line drivers $12\_0$ to $12\_n-1$ and the other end of the current path of the PMOS transistor 14 is connected to the power supply node VDD.

Further, one end of the current path of the PMOS transistor 14 is connected to one-side ends of the current paths of diode-connected PMOS transistors $LT\_0$ to $LT\_n-1$ and the gates thereof. The other ends of the current paths of the PMOS transistors $LT\_0$ to $LT\_n-1$ are connected to the power supply node VDD. The PMOS transistors $LT\_0$ to $LT\_n-1$ have substantially the same size (channel length and channel width) and the same plane form as the PMOS load transistors in the memory cell MC. The PMOS transistors $LT\_0$ to $LT\_n-1$ are arranged adjacent to the endmost column (paired bit lines $bl\_0$, $/bl\_0$) in the array which is continuous to the memory cells MC. The PMOS transistor 14 and PMOS transistors $LT\_0$ to $LT\_n-1$ function as a load circuit which sets the levels of multi-selected word lines to potential lower than the power supply voltage VDD.

Column decoders (Col. Dec) $15\_0$ to $15\_q$ are connected to the other ends of the paired bit lines $bl\_0$, $/bl\_0$ to $bl\_m-1$, $/bl\_m-1$ for every plural bit line pairs set as one unit. Data items of the bit line pairs selected by the column decoders 15_0 to 15_q are amplified by sense amplifiers 16_0 to 16_q and output as read data D0 to Dq.

A controller 17 is supplied with a signal LOWV which specifies a low-voltage operation, address signal ADD and control signal CNT. The row decoder 13, column decoders 15_0 to 15_q, precharging PMOS transistors pbl_0, /pbl_0 to pbl_m−1, /pbl_m−1, equalizing PMOS transistors ebl_0 to ebl_m−1 and PMOS transistor 14 are controlled based on the above signals.

FIG. 2 shows an example of the configuration of each memory cell MC in the circuit shown in FIG. 1. Each memory cell MC is a six-transistor cell configured by a pair of PMOS load transistors ld1, ld2, a pair of NMOS drive transistors dv1, dv2 and a pair of NMOS transfer transistors xf1, xf2.

The memory cell MC includes a flip-flop circuit configured by cross-coupling the input and output terminals of a first CMOS inverter INV1 formed of the PMOS load transistor ld1 and NMOS drive transistor dv1 to the output and input terminals of a second CMOS inverter INV2 formed of the PMOS load transistors ld2 and NMOS drive transistor dv2. The current paths of the NMOS transfer transistors xf1, xf2 are respectively connected between storage nodes n1, n2 of the flip-flop circuit and the paired bit lines BL, /BL and the gates of the NMOS transfer transistors xf1, xf2 are connected to a corresponding one of the word lines WL.

The PMOS load transistors ld1, ld2 are formed in an n-well region formed on the main surface of a semiconductor substrate. The NMOS drive transistors dv1, dv2 and NMOS transfer transistors xf1, xf2 are formed in a p-well region formed on the main surface of the semiconductor substrate.

Figure 3:
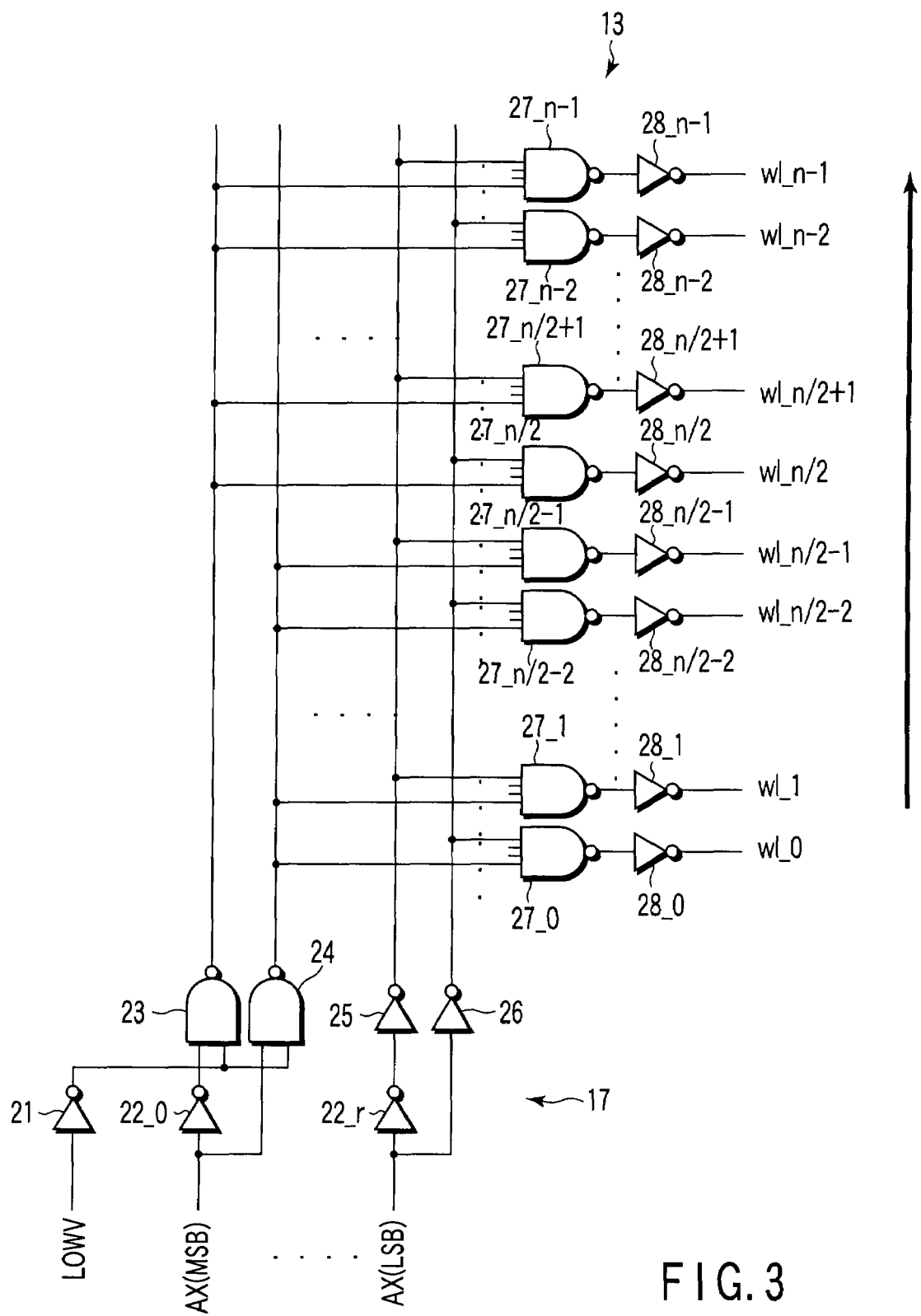
FIG. 3 is a circuit diagram showing a concrete example of the configuration of extracted portions of a controller and row decoder in the circuit shown in FIG. 1.

FIG. 3 shows a concrete example of the configuration of extracted portions of the controller 17 and row decoder 13 in the circuit shown in FIG. 1 and attention is paid to a logical circuit section which multi-selects word lines. In the controller 17, an inverter 21 which is supplied with a signal LOWV, inverters 22_0 to 22_r which are supplied with signals from the most significant bit AX (MSB) to the least significant bit AX (LSB) of a row address in the address signal ADD, NAND gates 23, 24 which simultaneously select two word lines and inverters 25, 26 acting as drivers are contained.

The most significant bit AX (MSB) of the address signal ADD is supplied to one input terminal of the NAND gate 23 via the inverter 22_0 and the signal LOWV is supplied to the other input terminal thereof via the inverter 21. Further, the most significant bit AX (MSB) of the address signal ADD is supplied to one input terminal of the NAND gate 24 and the signal LOWV is supplied to the other input terminal thereof via the inverter 21.

The row decoder 13 includes NAND gates 27_0 to 27_n−1 and inverters 28_0 to 28_n−1 respectively provided for the word lines wl_0 to wl_n−1. The row decoder 13 is configured to degenerate the most significant bit of the row address, simultaneously drive two word lines and supply read currents from two different SRAM cells to one bit line pair.

For example, the word lines wl_0 and wl_n/2 are simultaneously selected by the NAND gates 27_0, 27_n/2. Further, the word lines wl_1 and wl_n/2+1 are simultaneously selected by the NAND gates 27_1, 27_n/2+1. Likewise, the word lines wl_n/2−2 and wl_n−2 are simultaneously selected by the NAND gates 27_n/2−2, 27_n−2 and the word lines wl_n/2−1 and wl_n−1 are simultaneously selected by the NAND gates 27_n/2−1, 27_n−1.

Next, the schematic operation of the SRAM section in the semiconductor device according to the first embodiment is explained. In order to perform the process for a light load, the controller 17 sets the PMOS transistor 14 into a nonconductive state to lower the voltage VWL applied to the power supply terminal of the word line drivers 12_0 to 12_n−1 when a signal LOWV which specifies the low-voltage operation is set to a high level. Thus, the drive levels of the word lines wl_0 to wl_n−1 at the cell selection time are set lower than the power supply voltage VDD. For example, the potentials which drive the selected word lines at this time are set so that the operation speed will be set at substantially the same speed attained when one word line is selected and the potential of the selected word line is equal to the power supply potential applied to the cell.

In this example, the potentials of the selected word lines wl_0 to wl_n−1 are clamped at the level of (VDD−|Vthp|) by the diode-connected PMOS load transistors LT_0 to LT_n−1. In this case, |Vthp| indicates the absolute threshold voltage of the PMOS transistors LT_0 to LT_n−1.

Thus, since the current driving abilities of the NMOS transfer transistors xf1, xf2 are lowered when the levels of the selected word lines wl_0 to wl_n−1 are lowered, the stability of the cell can be enhanced like the case wherein the β ratio is enhanced.

Currents (cell currents) read from the storage nodes n1, n2 via the NMOS transfer transistors xf1, xf2 are reduced although the stability of the cell can be enhanced when the levels of the selected word lines wl_0 to wl_n−1 are lowered. Therefore, the data read speed is lowered. However, since read currents from two cells are supplied to one bit line pair by selecting two word lines and the cell current is doubled, a lowering in the data read speed can be prevented.

That is, when the signal LOWV is set to the high level, the most significant bit (MSB) of the row address is degenerated by the NAND gates 23, 24 and two word lines are simultaneously activated. Generally, since the word lines are arranged in an address progressing order as shown in FIG. 3, for example, the word line wl_n/2 in the array central portion is selected at the same time as the word line wl_0 in the array endmost portion by degenerating MSB.

When the word lines wl_n−1, wl_n−2, ... lying on the side far apart from the sense amplifiers 16_0 to 16_q are selected, influences given by the wiring resistances of the bit lines bl_0, /bl_0 to bl_m−1, /bl_m−1 become the largest and the read speed is set into the worst case. However, one of the word lines which are simultaneously selected is always positioned on the side closer to the sense amplifiers 16_0 to 16_q with respect to the array central portion by degenerating MSB of the row address as described above.

As a result, the effect that the worst bit line delay is alleviated can be attained in addition to the effect that the read current from the memory cell is doubled. Of course, if word lines are double-selected, the memory capacity is halved because two cells are used for storage of one bit. However, generally, since the large memory capacity is not required at the light-load processing time in comparison with the case of the heavy-load processing time, there occurs no problem even if the memory capacity is reduced.

Figure 4:
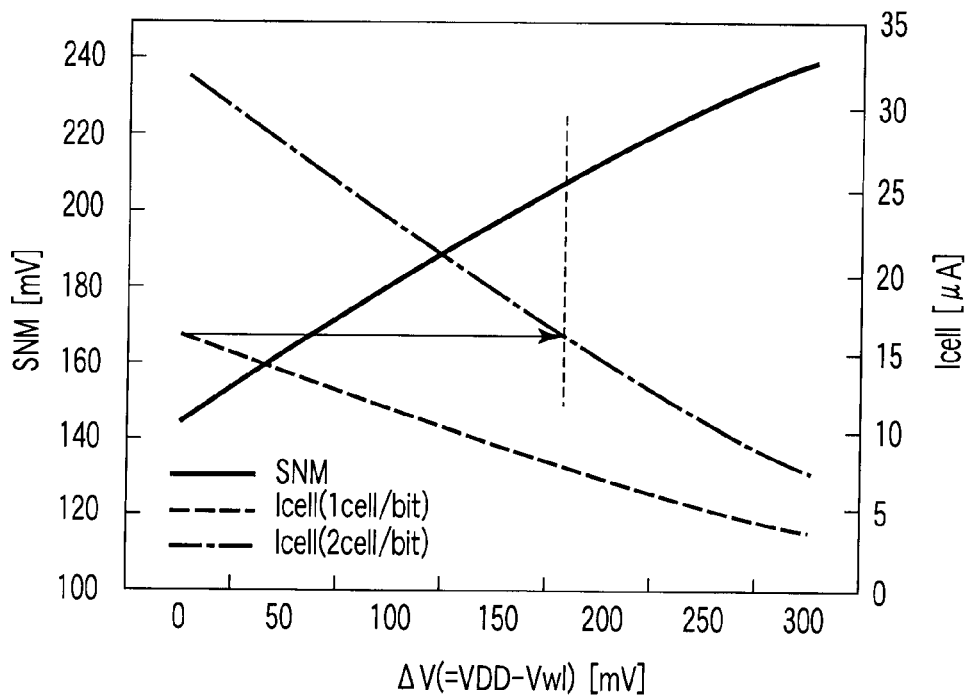
FIG. 4 is a characteristic diagram showing an example of a variation in the cell current and a static noise margin when the level of a selected word line is lowered.
Figure 5:
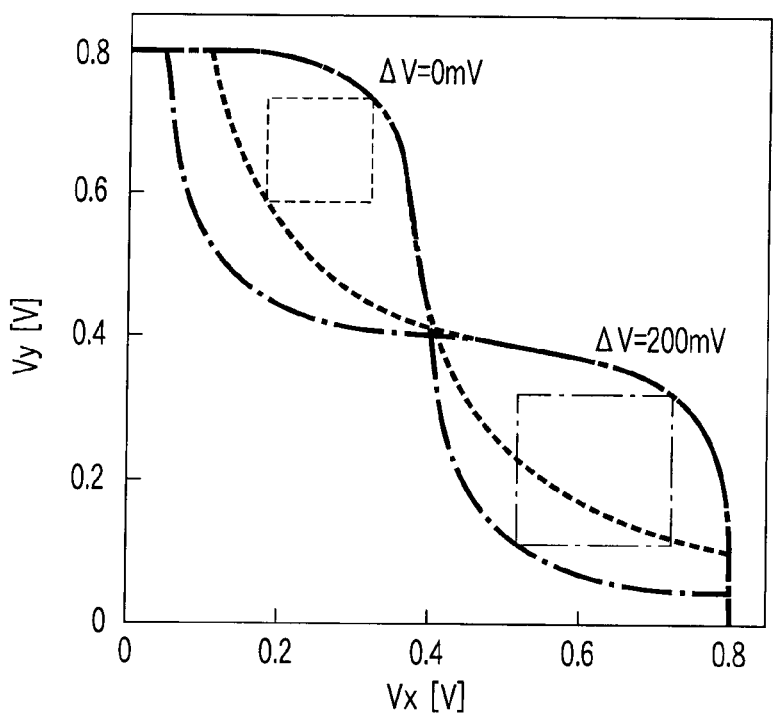
FIG. 5 is a characteristic diagram showing an input/output characteristic of a pair of inverters configuring an SRAM cell, for illustrating the static noise margin.

FIG. 4 is a characteristic diagram showing an example of a variation in the cell current and a static noise margin (SNM) when the level of a selected word line is lowered. SNM indicates an amount defined by the size of the maximum square which is inscribed in two input/output characteristic curves as shown by broken lines in FIG. 5 in the input/output characteristics of the paired inverters INV1, INV2 configuring the SRAM cell and is an index of the cell stability.

As shown in FIG. 4, SNM is increased as the voltage drop amount ΔV (=VDD−Vwl) from the power supply voltage VDD is increased, but the cell current Icell is reduced with an increase in ΔV. The conventional SNM and cell current correspond to a case of ΔV=0 V and one-cell/bit configuration (refer to the broken lines). In the present embodiment, by setting ΔV to approximately 180 mV and using a 2-cell/bit configuration (refer to one-dot-dash lines), SNM can be increased to approximately 1.5 times while the cell current which is substantially equal to the conventional cell current is maintained.

Next, a control method for controlling the drive levels of the word lines in the SRAM of the first embodiment is explained in detail. As shown in FIG. 1, the PMOS transistor 14 and a plurality of diode-connected PMOS transistors LT_0 to LT_n−1 are connected to the power supply terminals of the word line drivers 12_0 to 12_n−1. During normal operation (LOWV=L) performed with the heavy load, the PMOS transistor 14 is turned on and the word line voltage VWL is set equal to the power supply node VDD.

On the other hand, during low-voltage operation (LOWV=H) performed with the light load, the PMOS transistor 14 is turned off and the word line voltage VWL is set lower than the power supply node VDD. Then, the word line voltage VWL is clamped at a level which is lowered from the power supply voltage VDD by the absolute threshold voltage |Vthp| of the PMOS load transistors LT_0 to LT_n−1 by means of the PMOS load transistors LT_0 to LT_n−1. With the above configuration, the level of the selected word line can be set lower than the power supply voltage VDD during low-voltage operation. In FIG. 1, an example in which the n PMOS transistors LT_0 to LT_n−1 are connected in parallel is shown, but the level of the selected word line during low-voltage operation can be set to a desired value by changing the number of PMOS transistors connected in parallel.

Figure 6:
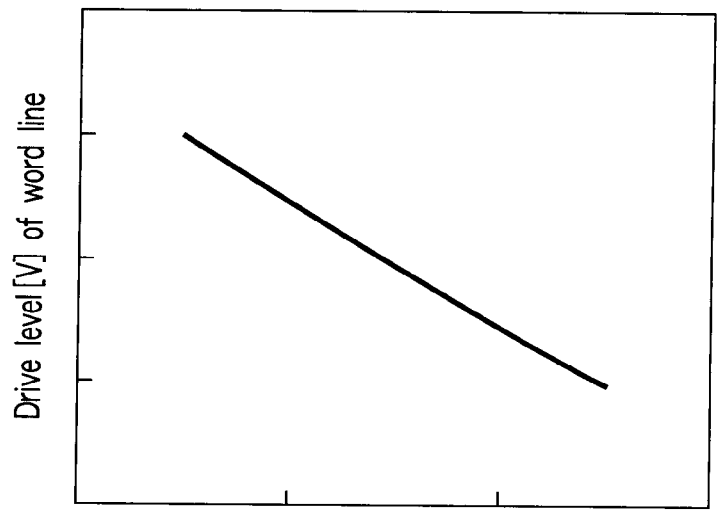
FIG. 6 is a characteristic diagram showing the relation between the level of the selected word line and the threshold voltage of the PMOS load transistor in the cell.

Further, as shown in FIG. 6, the write operation margin and SNM can be improved by setting the level of the selected word line to a value obtained by reflecting the threshold voltages of the PMOS load transistors ld1, ld2 of the SRAM cell. That is, SNM is lowered when the absolute threshold voltage |Vthp| of the PMOS load transistors ld1, ld2 of the SRAM cell becomes larger due to a variation in the manufacturing process. However, in this case, since the absolute threshold voltage |Vthp| of the diode-connected PMOS transistors LT_0 to LT_n−1 also becomes larger, the level of the selected word line is lowered to a larger extent and acts to increase SNM.

When the absolute threshold voltage |Vthp| of the PMOS load transistors ld1, ld2 of the cell becomes smaller due to a variation in the manufacturing process, the write operation margin is reduced. The write operation margin is determined by the ratio of pull-down by the NMOS transfer transistors xf1, xf2 to pull-up by the PMOS load transistors ld1, ld2. This is because the potential of the storage nodes n1, n2 cannot be sufficiently pulled down by the NMOS transfer transistors xf1, xf2 when the absolute threshold voltage |Vthp| of the PMOS load transistors ld1, ld2 becomes smaller. However, in this case, since the absolute threshold voltage |Vthp| of the diode-connected PMOS transistors LT_0 to LT_n−1 becomes smaller, the potential level of the selected word line is raised, the driving ability of the NMOS transfer transistors xf1, xf2 is enhanced and the write margin is increased.

Thus, it becomes possible to pay much attention to SNM when the absolute voltage |Vthp| is large and pay much attention to the write margin when the absolute voltage |Vthp| is small and thus it becomes possible to perform the low-voltage operation by setting the selected word line to a potential level obtained by reflecting the absolute threshold voltage |Vthp| of the PMOS load transistors ld1, ld2 of the SRAM cell.

Figure 7:
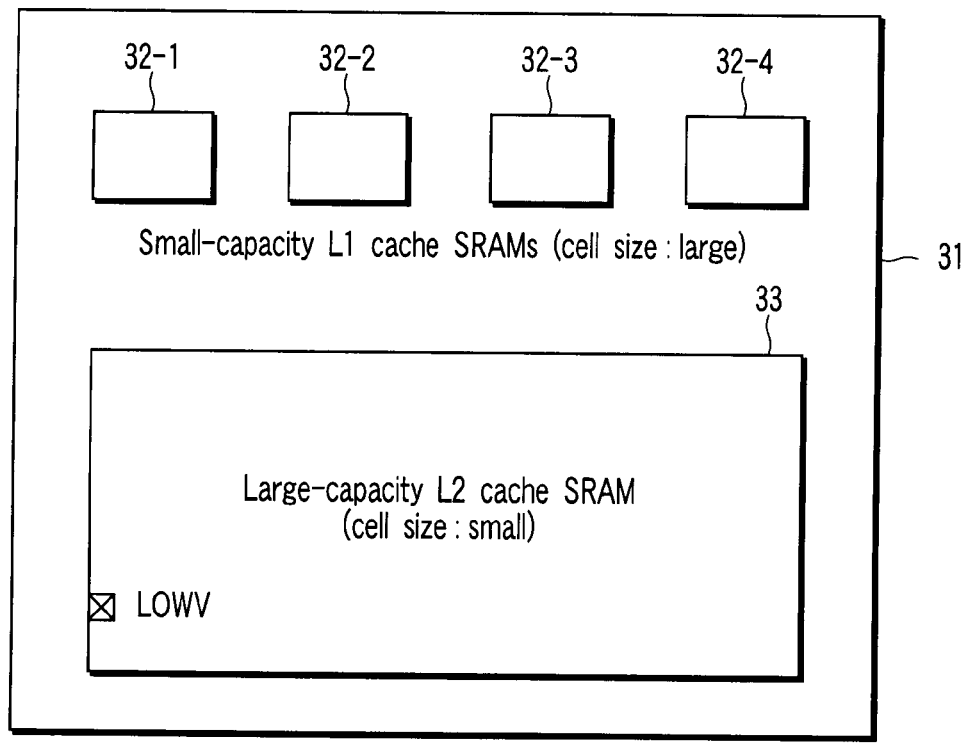
FIG. 7 is a block diagram showing an example of the configuration of an LSI having a cache SRAM incorporated therein.

FIG. 7 shows an example of the schematic configuration of an LSI having the above-described SRAM incorporated therein for cache. Generally, the cache memory in the chip 31 includes L1 cache SRAMs 32-1 to 32-4 with relatively small capacity and an L2 cache SRAM 33 with relatively large capacity. The occupied area of the L1 cache SRAMs 32-1 to 32-4 is small and the occupied area of the L2 cache SRAM 33 is large. Therefore, since the influence of the cell size of the L1 cache SRAMs 32-1 to 32-4 on the chip size is small although the cell size of the L1 cache SRAMs 32-1 to 32-4 is large and the influence of the cell size of the L2 cache SRAM 33 on the chip size is large, it is desirable to use a cell which is made as small as possible.

The low-voltage operation can be attained by using SRAM cells with large size which attain the high β ratio in the L1 cache SRAMs 32-1 to 32-4 in the chip 31. Further, SRAM cells with small size and low β ratio are used in the L2 cache SRAM 33 and a signal LOWV which specifies the low-voltage operation is supplied to control the SRAM cells during low-voltage operation.

Thus, by adequately and separately using the L1 cache SRAMs 32-1 to 32-4 with relatively small capacity and the L2 cache SRAM 33 with relatively large capacity in the chip 31, the power consumption can be suppressed while suppressing an increase in the chip size.

Therefore, according to the above configuration, since the level of the selected word line is set lower than the power supply voltage VDD, the current driving ability of the NMOS transfer transistors xf1, xf2 is lowered and the degree of stabilization of the cell can be enhanced like the case wherein the β ratio is increased. Further, since two word lines are simultaneously activated to simultaneously read data items from two cells, a sufficiently large read current can be attained. As a result, the low-voltage operation can be performed and the power consumption can be suppressed while the sufficient cell current is attained.

(Modification)

In the circuit shown in FIG. 3, one of the word lines which are simultaneously selected is always positioned on the side closer to the sense amplifiers 16_0 to 16_q with respect to the array central portion. However, as shown in FIG. 8, the word lines wl_0 to wl_n−1 may be so arranged that an address selecting operation will be performed to proceed towards the array center and then return therefrom. The circuit section shown in FIG. 8 is basically the same as the circuit shown in FIG. 3. Since only the arrangement of the NAND gates 27_0 to 27_n−1 and inverters 28_0 to 28_n−1 is different according to the arrangement of the word lines wl_0 to wl_n−1, corresponding portions are denoted by the same reference symbols and the detail explanation thereof is omitted.

In the case of the circuit configuration shown in FIG. 8, for example, the word line wl_n/2 at the array remotest portion is selected at the same time as the word line wl_0 at the array closest portion is selected by degeneration of MSB. Then, an address selection signal is generated to specify word lines towards the array center and then away therefrom. Therefore, since the average of distances from the ends of the paired bit lines to the two word lines simultaneously selected becomes equal to half the bit line length and the positions of the word lines simultaneously selected in the array can be averaged, the effect that the worst bit line delay is alleviated becomes larger than that attained by the circuit shown in FIG. 3.

SECOND EMBODIMENT

In the first embodiment, SNM is increased by lowering the potential level of the selected word line. However, if the level of the selected word line is lowered, the write margin is degraded. This is because the write operation margin is determined by the ratio of pull-down of the storage nodes n1, n2 by the NMOS transfer transistors xf1, xf2 to pull-up of the storage nodes n1, n2 by the PMOS load transistors ld1, ld2 and the pull-down ability of the NMOS transfer transistors xf1, xf2 is lowered by lowering the level of the selected word line.

Figure 9:
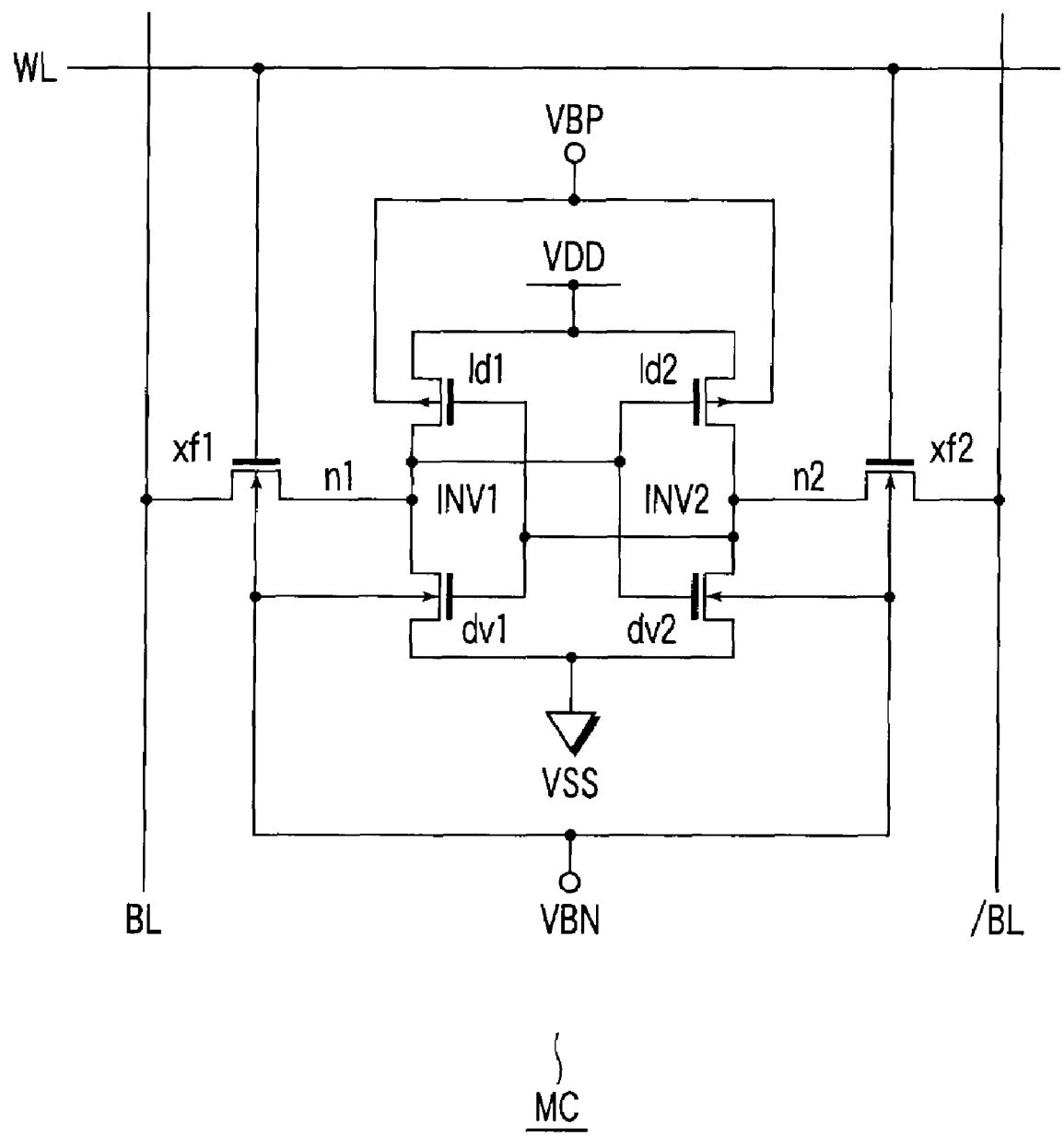
FIG. 9 is a circuit diagram showing an example of the configuration of a memory cell, for illustrating a semiconductor device according to a second embodiment of this invention.

In order to cope with the above problem, the bias of an n-well region in which memory cells are formed is prevented from becoming low during low-voltage operation in a semiconductor device according to a second embodiment. That is, only the power supply voltage VDD is lowered during low-voltage operation and bias voltage VBP higher than the power supply voltage VDD is applied to the n-well region in which PMOS load transistors ld1, ld2 are formed as shown in FIG. 9. Therefore, the back-gate bias of (VBP-VDD) is applied to the PMOS load transistors ld1, ld2. As a result, the threshold voltages of the PMOS load transistors ld1, ld2 are raised to increase the write margin.

In the first embodiment, SNM is increased by lowering the potential level of the selected word line, but SNM can also be increased by applying the bias voltage VBN lower than the ground potential VSS to a p-well region of the cell and applying the back-gate bias to the NMOS transistors xf1, xf2, dv1, dv2 from the p-well region. Since the threshold voltages of the NMOS transistors xf1, xf2, dv1, dv2 of the cell are raised when the back-gate bias is applied, a cell current will be reduced. However, the cell current is increased by multi-selecting the word lines and the operation speed can be prevented from being lowered.

THIRD EMBODIMENT

FIG. 10 is a circuit diagram schematically showing an extracted portion of the configuration of a memory cell array of a cache SRAM and the peripheral portion thereof, for illustrating a semiconductor device according to a third embodiment of this invention. The cache SRAM is incorporated in an LSI whose operation frequency and power supply voltage are dynamically controlled according to a load subjected to a process to be performed.

In the first embodiment, the same plane-form PMOS transistors with the same size (channel length, channel width) as that of the PMOS load transistors dl1, dl2 are diode-connected and connected to the word lines for control of the level of the selected word line. However, as shown in FIG. 10, a PMOS transistor 18 having substantially the same threshold voltage as that of the PMOS load transistors id1, ld2 of the SRAM cell may be provided.

The current path of the PMOS transistor 18 is connected at one end to the power supply node VDD and the other end of the current path and the gate thereof are connected to power supply terminals of word line drivers 12_0 to 12_n–1 and one end of the current path of a PMOS transistor 14. The PMOS transistors 14, 18 act as a load circuit which sets potential levels of the multi-selected word lines to potential lower than the power supply voltage.

With the above configuration, the same operation and effect as those of the first and second embodiments can be attained. Further, since the level of the selected word line can be set by means of one PMOS transistor 18, the pattern-occupied area can be reduced in comparison with a case wherein the PMOS transistors LT_0 to LT_n–1 are provided for the respective word lines.

FOURTH EMBODIMENT

Figure 11:
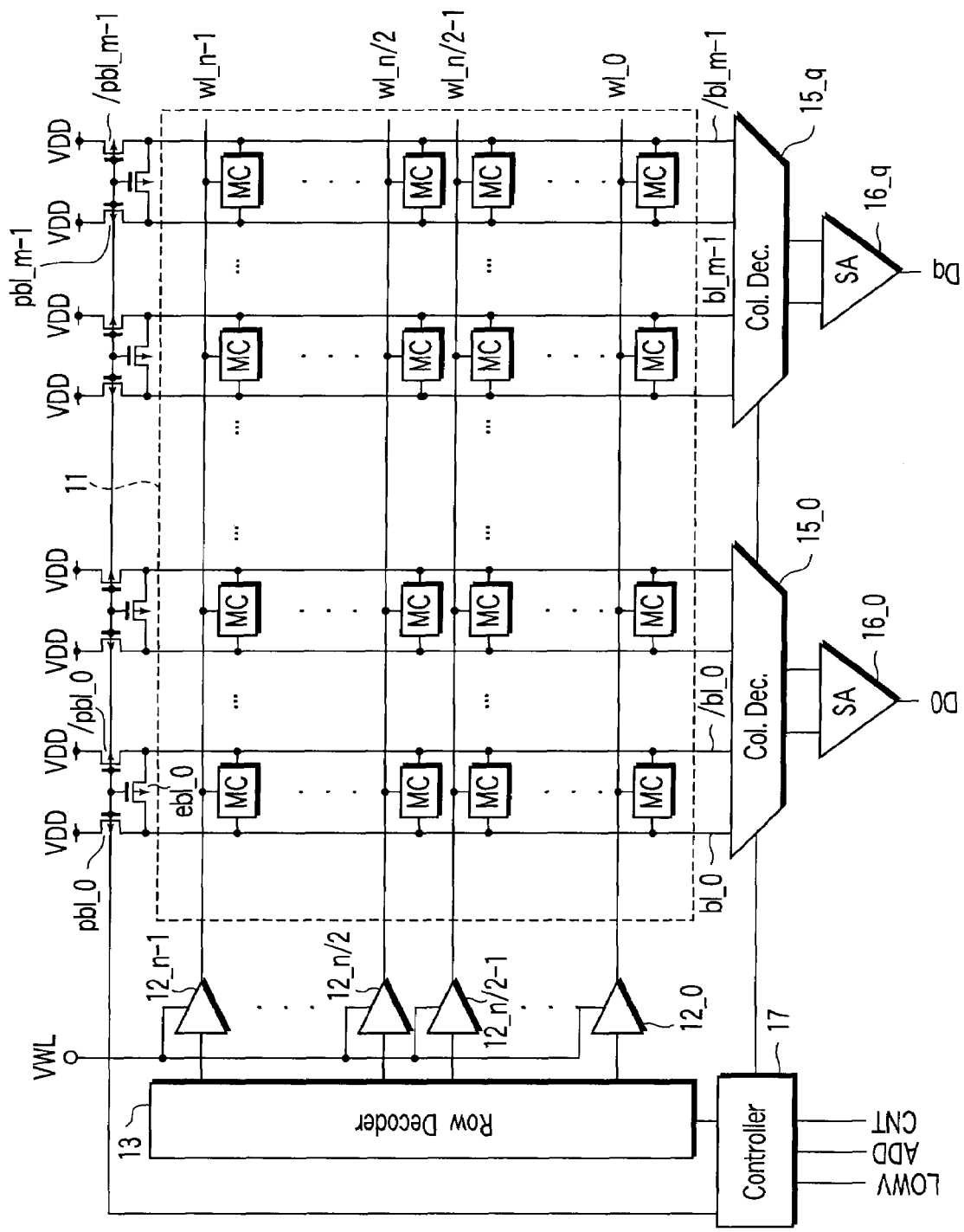
FIG. 11 is a circuit diagram schematically showing an extracted portion of the configuration of a memory cell array of a cache SRAM and the peripheral portion thereof, for illustrating a semiconductor device according to a fourth embodiment of this invention.

FIG. 11 is a circuit diagram schematically showing an extracted portion of the configuration of a memory cell array of a cache SRAM and the peripheral portion thereof, for illustrating a semiconductor device according to a fourth embodiment of this invention. The cache SRAM is incorporated in an LSI whose operation frequency and power supply voltage are dynamically controlled according to a load subjected to a process to be performed.

In each of the above embodiments, the voltage VWL is generated by means of the diode-connected PMOS transistors LT_0 to LT_n–1 or PMOS transistor 18. However, in the fourth embodiment, the word line voltage VWL is supplied from the exterior of the SRAM. That is, a load circuit which sets the level of the multi-selected word lines to potential lower than the power supply voltage is provided outside the LSI. Alternatively, the load circuit is provided in a portion other than the SRM portion in the LSI to apply word line voltage VWL.

With the above configuration, it is of course possible to attain the same operation and effect as those of the first to third embodiments.

In the first to fourth embodiments, a case wherein two word lines are simultaneously selected is explained as an example, but three or more word lines can be multi-selected unless the voltage does not become lower than the operation voltage of the transistors configuring the SRAM cell.

Further, when a margin is provided in the specification of products and it is permitted to lower the operation speed, only one word line can be selected without multi-selecting the word lines.

In addition, the technique for expanding this invention and lowering the level of the word line for each product when the margin of the product is small can be contained in the idea of this invention.

As explained above, according to the large-capacity SRAM incorporated in the LSI whose operation frequency and power supply voltage are dynamically controlled according to the present embodiment, the level of the selected word line is set lower than the power supply voltage according to the threshold voltage of the PMOS load transistors in the SRAM cell during low-voltage operation and the β ratio can be doubled while the cell current equivalent to the cell current in the normal case (one-cell/bit) is maintained by double-selecting word lines (2-cell/bit).

Thus, the low-voltage operation can be performed and the power consumption can be suppressed while maintaining the sufficient cell current.

Therefore, according to one aspect of this invention, a semiconductor device in which the low-voltage operation can be performed and the power consumption can be suppressed while maintaining the sufficient cell current of the SRAM can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device whose operation frequency and power supply voltage are dynamically controlled according to a load subjected to a process to be performed, comprising:
    a memory cell array having SRAM cells arranged in an array form,
    word lines connected to the SRAM cells of the memory cell array for respective rows in the memory cell array,
    a row decoder configured to select the word lines one by one during heavy-load operation and multi-select separated word lines during light-load operation,
    a load circuit configured to set levels of the multi-selected word lines to potential lower than power supply voltage, and
    a controller configured to control the row decoder and load circuit to selectively control a selection operation of the word lines and a level setting operation of the word lines by the load circuit.

2. The semiconductor device according to claim 1, further comprising bit line pairs connected to the SRAM cells of the memory cell array for respective columns in the memory cell array.

3. The semiconductor device according to claim 2, wherein the row decoder is configured to degenerate the most significant bit of a row address and simultaneously drive two of the word lines and a read operation is performed by supplying read currents from different two SRAM cells to one bit line pair.

4. The semiconductor device according to claim 2, further comprising column decoders each of which is provided for every plural bit line pairs used as one unit and selects data of the bit line pair for each unit and a sense amplifier configured to amplify a potential variation of the bit line pair selected by the column decoder and read stored data.

5. The semiconductor device according to claim 4, wherein the row decoder simultaneously drives two of the word lines during low-voltage operation and one of the two word lines simultaneously driven lies closer to the sense amplifier with respect to the center of the bit line pair.

6. The semiconductor device according to claim 5, wherein the average of distances from one end of the bit line pair to the two word lines simultaneously driven is half the length of the bit line pair.

7. The semiconductor device according to claim 1, wherein an operation of multi-selecting the word lines by the row decoder is performed to proceed towards the center of the memory cell array and return therefrom.

8. The semiconductor device according to claim 1, further comprising a word line driver configured to be supplied with a row decode signal output from the row decoder and controlled by the controller to selectively drive the word lines.

9. The semiconductor device according to claim 8, wherein the SRAM cell includes a first PMOS load transistor having a current path connected at one end to a power supply node, a first NMOS drive transistor having a current path connected at one end to the other end of the current path of the first PMOS load transistor and connected at the other end to a ground node and a gate connected to a gate of the first PMOS load transistor, a second PMOS load transistor having a current path connected at one end to the power supply node, a second NMOS drive transistor having a current path connected at one end to the other end of the current path of the second PMOS load transistor and connected at the other end to the ground node and a gate connected to a gate of the second PMOS load transistor, a first NMOS transfer transistor having a current path connected at one end to one of the paired bit lines and connected at the other end to the gate of the second PMOS load transistor, the gate of the second NMOS drive transistor, the other end of the current path of the first PMOS load transistor and one end of the current path of the first NMOS drive transistor and a gate connected to a corresponding one of the word lines, and a second NMOS transfer transistor having a current path connected at one end to the other one of the paired bit lines and connected at the other end to the gate of the first PMOS load transistor, the gate of the first NMOS drive transistor, the other end of the current path of the second PMOS load transistor and one end of the current path of the second NMOS drive transistor and a gate connected to the corresponding word line.

10. The semiconductor device according to claim 9, wherein the load circuit includes first PMOS transistors each of which has substantially the same channel length and channel width as those of the first and second PMOS load transistors in the SRAM cell and whose current paths are connected at one-side ends to the power supply node, and a second PMOS transistor having a current path connected at one end to gates and the other ends of the current paths of the first PMOS transistors and connected at the other end to the power supply node and a gate supplied with an output signal of the controller, and a common connection node of the first and second PMOS transistors is connected to a power supply terminal of the word line driver.

11. The semiconductor device according to claim 9, wherein the load circuit includes third PMOS transistors each of which has substantially the same threshold voltage as those of the first and second PMOS load transistors in the SRAM cell and whose current paths are connected at one end to the power supply node, and a fourth PMOS transistor having a current path connected at one end to gates and the other ends of the current paths of the third PMOS transistors and connected at the other end to the power supply node and a gate supplied with an output signal of the controller, and a common connection node of the third and fourth PMOS transistors is connected to the power supply terminal of the word line driver.

12. The semiconductor device according to claim 9, wherein the first and second PMOS load transistors are formed in an n-well region and the first and second NMOS drive transistors and first and second NMOS transfer transistors are formed in a p-well region.

13. The semiconductor device according to claim 12, wherein the threshold voltage is raised by applying bias voltage higher than the power supply voltage to the n-well region to apply back-gate bias to the first and second PMOS load transistors during the light-load operation.

14. The semiconductor device according to claim 12, wherein the threshold voltage is raised by applying bias voltage lower than ground potential to the p-well region to apply back-gate bias during the light-load operation.

15. A semiconductor device comprising:
    a memory cell array having SRAM cells arranged in an array form,
    word lines connected to the SRAM cells of the memory cell array for respective rows,
    bit line pairs connected to the SRAM cells of the memory cell array for respective columns,
    a row decoder configured to select the word lines one by one during heavy-load operation and multi-select separated word lines during light-load operation,
    a word line driver configured to drive the word lines based on a decode signal supplied from the row decoder,
    a precharge/equalize circuit configured to precharge and equalize the paired bit lines, a column decoder configured to select the bit line pairs for every plural bit line pairs used as one unit, a sense amplifier configured to amplify a potential variation of the bit line pair selected by the column decoder and read stored data, a load circuit configured to set levels of the multi-selected word lines to potential lower than power supply voltage, and a controller configured to control the precharge/equalize circuit, row decoder, column decoder and load circuit to selectively control a selection operation of the word lines and a level setting operation of the word lines by the load circuit.

16. The semiconductor device according to claim 15, wherein the load circuit includes a first PMOS transistor having a current path connected at one end to a power supply node and connected at the other end to a power supply terminal of the word line driver and a gate supplied an output signal of the controller, and second PMOS transistors each having a gate and one end of a current path connected to the other end of the current path of the first PMOS transistor and connected at the other end to the power supply node.

17. The semiconductor device according to claim 16, wherein the second PMOS transistors each have substantially the same channel length and channel width as those of the PMOS load transistors in the SRAM cell.

18. The semiconductor device according to claim 15, wherein the load circuit includes a first PMOS transistor having a current path connected at one end to a power supply node and connected at the other end to a power supply terminal of the word line driver and a gate supplied an output signal of the controller, and a second PMOS transistor having a current path connected at one end to the power supply node and a gate and the other end of the current path connected to the power supply terminal of the word line driver.

19. The semiconductor device according to claim 15, wherein the second PMOS transistor has substantially the same threshold voltage as those of the PMOS load transistors in the SRAM cell.

20. A semiconductor device comprising:

a memory cell array having SRAM cells arranged in an array form, word lines connected to the SRAM cells of the memory cell array for respective rows, bit line pairs connected to the SRAM cells of the memory cell array for respective columns, a row decoder configured to select the word lines one by one during heavy-load operation and multi-select separated word lines during light-load operation, a word line driver configured to drive the word lines based on a decode signal supplied from the row decoder, a precharge/equalize circuit configured to precharge and equalize the paired bit lines, a column decoder configured to select data of the bit line pair for every plural bit line pairs used as one unit, a sense amplifier configured to amplify a potential variation of the bit line pair selected by the column decoder and read stored data, and a controller configured to control the precharge/equalize circuit, row decoder, column decoder and a load circuit to selectively control a selection operation of the word lines and a level setting operation of the word lines by the load circuit, wherein potential lower than power supply voltage is applied to a power supply terminal of the word line driver when the word lines are multi-selected.

* * * * *